United States Patent
Nigam et al.

(10) Patent No.: US 10,374,566 B2
(45) Date of Patent: Aug. 6, 2019

(54) PERCEPTUAL POWER REDUCTION SYSTEM AND METHOD

(71) Applicant: Maxim Integrated Products, Inc., San Jose, CA (US)

(72) Inventors: Vivek P. Nigam, Dublin, CA (US); Robert Polleros, Sunnyvale, CA (US); Wen Jin, San Diego, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 4 days.

(21) Appl. No.: 15/661,355

(22) Filed: Jul. 27, 2017

(65) Prior Publication Data

US 2018/0034433 A1 Feb. 1, 2018

Related U.S. Application Data

(60) Provisional application No. 62/368,355, filed on Jul. 29, 2016.

(51) Int. Cl.

| H04R 3/04 | (2006.01) |
| H03G 3/32 | (2006.01) |
| H03G 3/30 | (2006.01) |
| H04R 29/00 | (2006.01) |
| H03G 5/00 | (2006.01) |
| H03G 5/16 | (2006.01) |

(52) U.S. Cl.
CPC ............ *H03G 3/32* (2013.01); *H03G 3/3005* (2013.01); *H03G 5/005* (2013.01); *H03G 5/165* (2013.01); *H04R 3/04* (2013.01); *H04R 29/001* (2013.01); *H04R 2420/07* (2013.01); *H04R 2430/03* (2013.01); *H04R 2460/03* (2013.01)

(58) Field of Classification Search
CPC .......... H04R 3/04; H04R 29/001; H03G 3/32; H03G 3/3005; H03G 5/005; H03G 5/165
USPC .................... 381/104–109, 57, 73.1, 103, 55
See application file for complete search history.

(56) References Cited

U.S. PATENT DOCUMENTS

| 9,312,829 | B2 * | 4/2016 | Tracey | H03G 3/32 |
| 9,607,628 | B2 * | 3/2017 | Gautama | G10L 21/0316 |
| 9,691,408 | B2 * | 6/2017 | Reams | G10L 19/028 |
| 9,705,461 | B1 * | 7/2017 | Seefeldt | H03G 3/32 |
| 2007/0237343 | A1 * | 10/2007 | Schobben | H04R 3/04 381/111 |
| 2011/0044471 | A1 * | 2/2011 | Aarts | H04R 3/04 381/98 |
| 2014/0037108 | A1 * | 2/2014 | Christoph | H03G 3/20 381/107 |
| 2014/0140555 | A1 * | 5/2014 | Pilgrim | H04R 25/407 381/317 |
| 2017/0011748 | A1 | 1/2017 | Porter et al. | |
| 2017/0111737 | A1 * | 4/2017 | Painter | H04R 3/04 |

(Continued)

*Primary Examiner* — Disler Paul
(74) *Attorney, Agent, or Firm* — Kevin E. West; Advent, LLP (57) ABSTRACT

A method of reducing power consumed by an audio playback system includes: receiving a signal from a digital audio interface; comparing a sound pressure level (SPL) response of a first frequency band of the signal to a total SPL response of the signal, the first frequency band including frequencies lower than a selected frequency; and attenuating signal components in the first frequency band of the signal based upon the comparison of the SPL response of the first frequency band of the signal to the total SPL response of the signal.

15 Claims, 7 Drawing Sheets

(56) References Cited

U.S. PATENT DOCUMENTS

2017/0155368 A1* 6/2017 Seefeldt .................. H03G 3/32
2017/0280241 A1* 9/2017 Iyer ......................... H04R 3/04

* cited by examiner

PERCEPTUAL POWER REDUCTION SYSTEM AND METHOD

CROSS-REFERENCE TO RELATED APPLICATIONS

The present application claims the benefit under 35 U.S.C. § 119(e) of U.S. Provisional Application Ser. No. 62/368,355, filed Jul. 29, 2016, and titled "PERCEPTUAL POWER REDUCTION SYSTEM AND METHOD," which is incorporated herein by reference in its entirety.

BACKGROUND

The principle of audio masking can be leveraged to reduce power consumption in an audio playback system. For example, audio signals at frequencies that are masked by other frequencies may be attenuated to reduce overall power consumption. However, this approach alone may not result in very significant power savings and can introduce measurable and possibly audible sound pressure level (SPL) reductions. There is a need for power reduction techniques that take SPL into account.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Overview

Psychoacoustics describe how a listener (e.g., an average human listener) perceives sounds. In particular, the psychoacoustics principle of "auditory masking" means that during audio playback (e.g., playback of music, speech, or any other synthesized or recorded sound) there may be frequencies that are at least partially or completely masked by other frequencies and are therefore rendered inaudible (i.e., cannot be heard by an average listener). As used herein, a threshold for a "listener" or an "average listener" generally refers to a threshold for one or more audio parameters (e.g., frequency, amplitude, SPL, etc.), where the threshold can be arbitrarily set (e.g., by the listener) and/or determined based upon a calculation that is specific to a listener, and/or based upon a predetermined statistical average. The masked frequencies are good candidates for attenuation to save overall power during music playback because their removal will reduce hardware operations (e.g., filtering, amplification, and/or other signal processing) without having a negative impact on the audio quality perceived by the listener.

It has also been found that some loudspeakers (e.g., small loudspeakers, such as those used for headphones and other personal listening devices) cannot reproduce low frequencies efficiently. Accordingly, low frequencies (e.g., below a threshold frequency) can also be attenuated to save power consumption without affecting (or by only minimally affecting) the listening experience of an average user.

A system and method are disclosed for reducing power consumed by an audio playback system (e.g., power consumed by circuitry and/or a processor executing one or more software modules) by utilizing the principles of auditory masking and taking into account speaker SPL response. The system attenuates signal components at frequencies that do not produce a perceptible auditory response for average human listeners. In embodiments, the system includes a controller that receives a signal from a digital audio interface. The controller is configured to compare a SPL response of a first frequency band (sometimes referred to herein as the "low band" or "low frequency band") of the signal to a total SPL response of the signal. The first frequency band can include signal components at frequencies lower than a selected (e.g., predetermined threshold) frequency. The controller is further configured to attenuate the signal components in the first frequency band of the signal based upon the comparison of the SPL response of the first frequency band of the signal to the total SPL response of the signal. For example, the controller can be configured to compare the SPL response of the first frequency band of the signal to the total SPL response of the signal by determining a ratio of the SPL response of the first frequency band of the signal to the total SPL response of the signal and comparing the determined ratio to a threshold ratio. In some implementations, the ratio is determined based on root mean square (RMS) values for the SPL response of the first frequency band and the total SPL response of the signal. The signal components in the first frequency band of the signal may be attenuated when the determined ratio is less than the threshold ratio.

Example Implementations

FIGS. 1A through 1D illustrate an audio playback system 100 in accordance with various embodiments of this disclosure. Those skilled in the art will appreciate that the embodiments illustrated in the drawings and/or described herein may be fully or partially combined to result in additional embodiments. Substitutions and other modifications can also be made without departing from the scope of this disclosure. Accordingly, the illustrated and described embodiments should be understood as explanatory and not as limitations of the present disclosure.

Figure 1A:
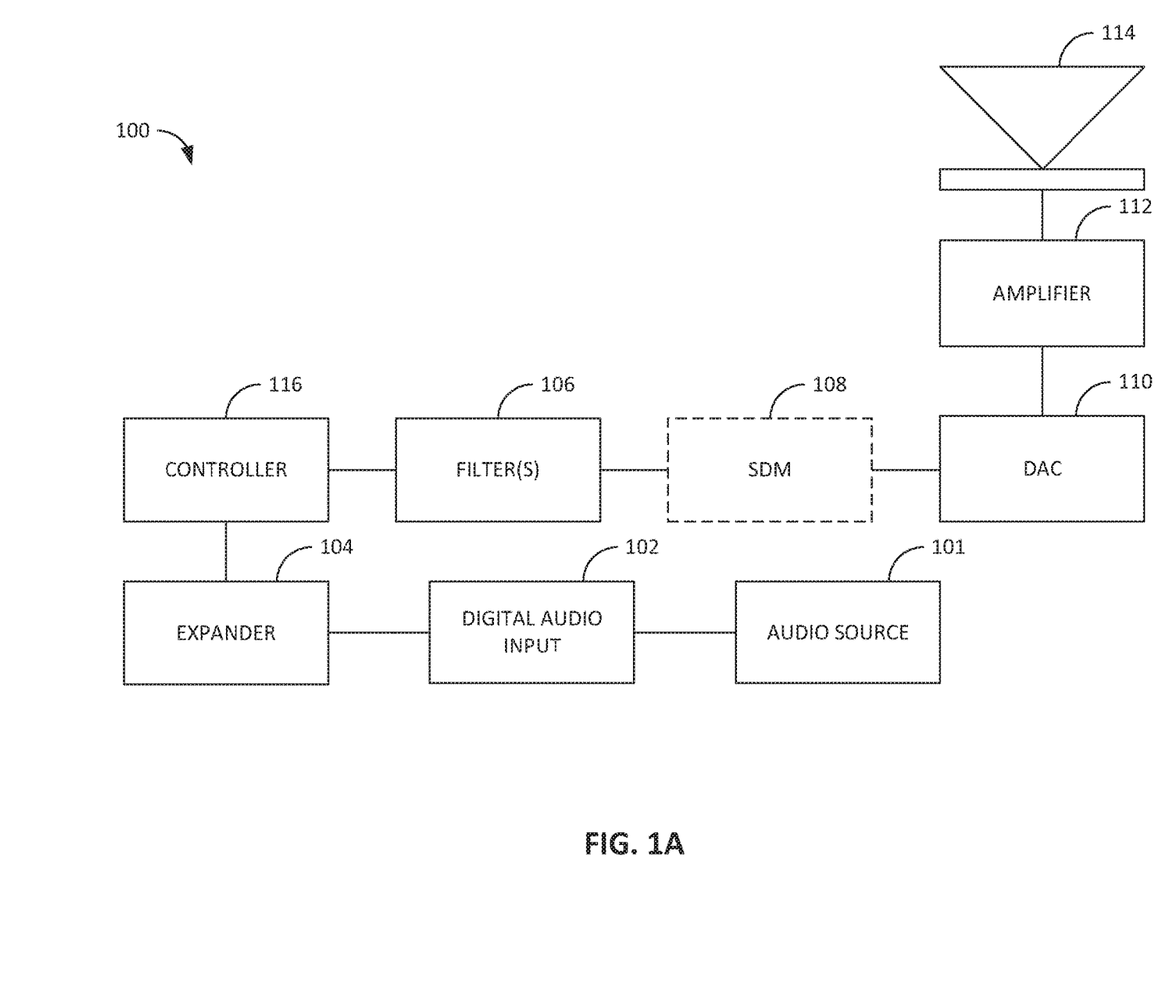
FIG. 1A is a block diagram illustrating an audio playback system that can include a system for reducing power consumed by the audio playback system, in accordance with an example embodiment of this disclosure.

FIG. 1A is a schematic depiction of an audio playback system 100 in accordance with an example embodiment of this disclosure. As shown, the audio playback system 100 includes an expander 104 that controls the gain level of a signal from a digital audio input/interface (DAI) 102 prior to filtering. For example, the expander 104 includes and/or controls an amplifier and/or attenuator coupled to the DAI 102. The expander 104 is configured to control a gain level of a signal or portions thereof (e.g., various signal components) after the signal is fed into the audio playback system 100 from the DAI 102. In some embodiments, the expander 104 is configured to attenuate signal components below a predetermined minimum frequency or above a predetermined maximum frequency.

The DAI 102 can be communicatively coupled to an audio source 101 (e.g., a mobile device (e.g., smartphone, tablet, smartwatch, activity tracker, digital camera, notebook computer, portable media player, portable gaming device, portable storage device, etc.), an audio receiver, a television, a personal computer, or the like). For example, the audio playback system 100 can be incorporated within the audio source 101 or can be communicatively coupled to the audio source 101 by a wired or wireless connection. In embodiments, the DAI 102 can include, but is not limited to, an audio input jack/pin, a wireless receiver/transceiver, a magnetic or optical receiver or read head, or any combination thereof.

The audio playback system 100 further includes one or more filters 106, for example, the system 100 can include a digital signal processing (DSP) core (including one or more infinite impulse response (IIR) filters), a cascaded integrator-comb (CIC) filter stage, and possibly other filters. These filters 106 may process the signal before it is fed into a digital-to-analog converter (DAC) 110 that outputs the audio signal to a speaker amplifier 112 coupled with an output device 114 (e.g., a loudspeaker, mini-loudspeaker, micro-loudspeaker, audio transmitter, or the like). In some embodiments, the audio playback system 100 further includes a sigma-delta modulator (SDM) 108 that is configured to encode the signal before it is fed into the DAC 110.

The audio playback system 100 further includes a controller 116 configured to execute one or more modules 121 that cause the controller to selectively attenuate signal components based on an SPL response of a signal components within a first frequency band having frequencies below a selected frequency. For example, the controller 116 is configured to receive a signal from the DAI 102. The controller 116 is configured to filter or otherwise isolate signal components in a first frequency band of the signal. For example, the controller 116 can be configured to apply a low pass filter that isolates signal components in the first frequency band (e.g., signal components having frequencies below a selected frequency). In some implementations, the selected frequency is less than or equal to 1 kHz, for example, the selected frequency can include a frequency approximately in the range of 50 to 500 Hz or more particularly 100 Hz to 300 Hz. The selected frequency may additionally or alternatively be based on a speaker SPL response of the audio playback system 100. For example, the selected frequency can be based on a comparison of speaker SPL response to threshold of human hearing for an average person, or possibly for a demographic or even for a particular individual (e.g., based on a user input/selection). For example, FIG. 2 includes a plot 200 that graphically depicts examples of a speaker SPL response 202 in comparison to curve representing threshold of human hearing 204 (e.g., for an average listener) at various frequencies. The selected frequency can include a frequency 206, where the speaker SPL response 202 is less than the threshold of human hearing 204 at the frequencies below frequency 206 (e.g., approximately 300 kHz in FIG. 2). The speaker SPL response 202 can be a known or predetermined response (e.g., based on a particular product model and/or predetermined signal parameters).

Figure 2:
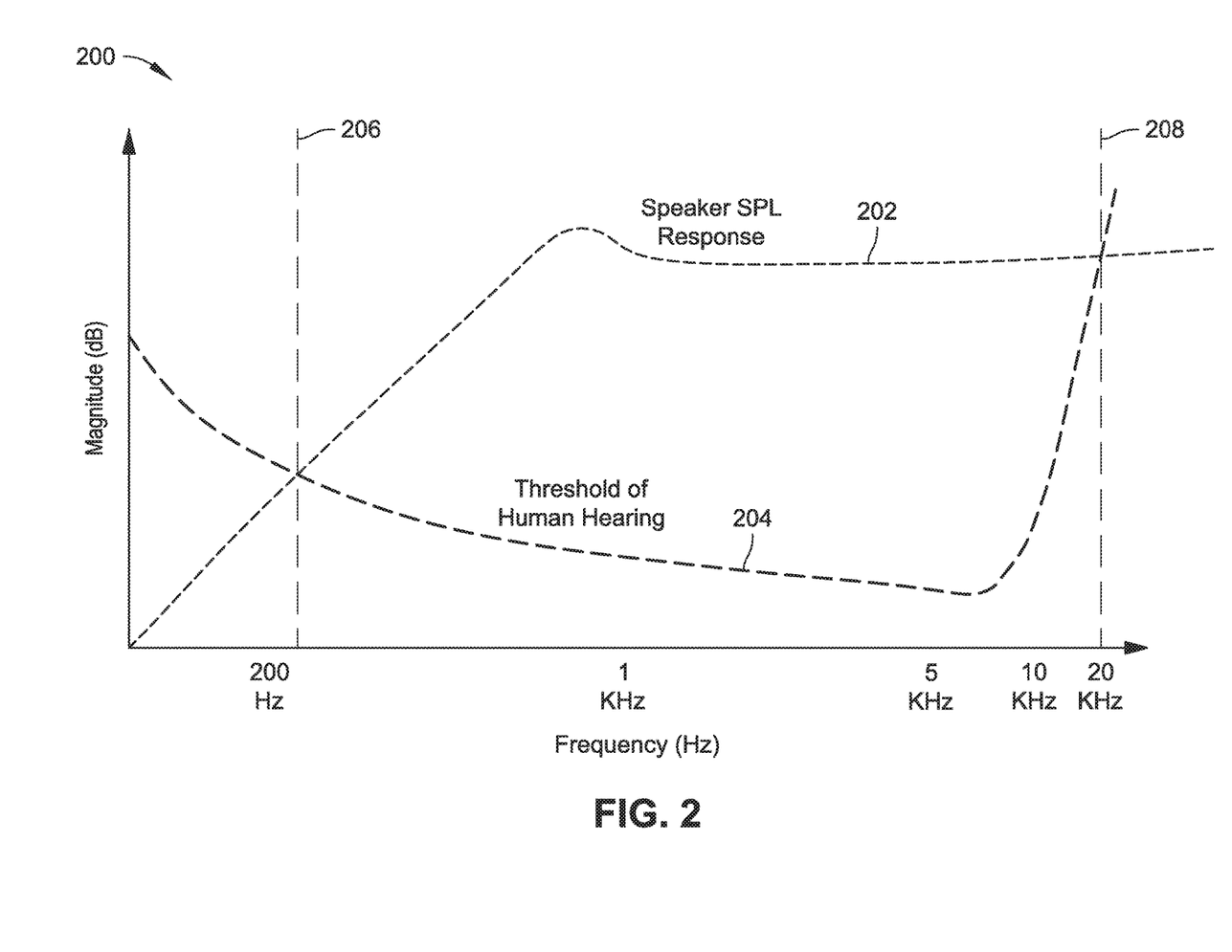
FIG. 2 is a graph illustrating an example speaker SPL response in comparison to a threshold of human hearing for an average person.

After filtering out or otherwise isolating the signal components in the first frequency band, the controller 116 is configured to compare a SPL response of the first frequency band of the signal to a total SPL response of the signal. In embodiments, the controller 116 is configured to determine a ratio of the SPL response of the first frequency band of the signal to the total SPL response of the signal and compare the determined ratio to a threshold ratio (e.g., a predetermined threshold ratio and/or a threshold ratio based on a speaker SPL response (e.g., speaker SPL response 202)). In some implementations, the threshold ratio is approximately in the range of −30 dB to −20 dB. The threshold ratio can additionally or alternatively be based on the SPL response of the audio playback system. For example, the threshold ratio can be based on a dynamic range of the speaker SPL response. In some embodiments, the determined ratio is based on RMS values of the SPL response of the first frequency band of the signal and the total SPL response of the signal. For example, the controller 116 can be configured to determine a RMS value of the SPL response of the first frequency band and an RMS value of the total SPL response, where the determined ratio is a ratio of the RMS value of the SPL response of the first frequency band of the signal to the RMS value of the total SPL response of the signal.

The controller 116 is further configured to attenuate signal components in the first frequency band of the signal based upon the comparison of the SPL response of the first frequency band of the signal to the total SPL response of the signal. For example, the controller 116 can be configured to attenuate the signal components in the first frequency band of the signal when the determined ratio is less than the threshold ratio. When the determined ratio is lower than the threshold ratio, the controller 116 can be configured to attenuate the signal components in the first frequency band to zero, near zero (e.g., attenuate the signal components in the first frequency band to be substantially zero), or completely remove (e.g., filter out or delete) the signal components in the first frequency band from the signal. When the determined ratio is greater than the threshold ratio, the controller 116 is configured to preserve the signal components in the first frequency band because removing them may affect the audio perceived by the listener. The controller 116 can be configured to preserve signal components in a second frequency band (e.g., signal components having frequencies above the selected frequency) when the controller 116 initially filters out or otherwise isolates the signal components in the first frequency band. The controller 116 may be further configured to generate an output signal by adding (e.g., rejoining) the signal components in the first frequency band of the signal and the signal components in the second frequency band of the signal when the determined ratio is greater than the threshold ratio.

In some embodiments, the output device 114 comprises a miniature speaker or micro-speaker, and the speaker amplifier 112 may be optimized for use with a mini or microspeaker. For example, the audio playback system 100 may be designed for a mobile device (e.g., portable media player, smartphone, tablet, smartwatch, notebook computer, or the like). As previously noted herein, it has been found that small loudspeakers cannot reproduce low frequencies efficiently. Additionally, low frequency signal components may be masked by higher frequency components anyway. Taking these two factors into account, the audio playback system 100 can be configured to attenuate (e.g., reduce to zero or completely remove) or filter out these signal components without diminishing the listening experience of an average user. This is shown in FIG. 2, where an example of a small loudspeaker SPL is illustrated in comparison with threshold of human hearing. As can be seen, at low frequencies (e.g., below approximately 300 Hz in FIG. 2), the speaker SPL is so low that an average person cannot hear many of the signals being produced anyway. Accordingly, cutting them out has little to no effect on the audio being heard from the loudspeaker. In some cases, this can result in a power savings of up to 10% or more without any negative effect on the user's listening experience. In some embodiments, the controller 116 is further configured to attenuate signal components above a second selected frequency (too high for most humans to hear) in order to further reduce power consumption by the audio playback system 100. For example, as shown in FIG. 2, signal components having frequencies above a second (higher) selected frequency 208 (e.g., above approximately 20 kHz in FIG. 2) may be too high frequency for most listeners to hear, and therefore these signal components can also be attenuated without affecting the user listening experience. This can also result in a potential power savings (e.g., up to 5% or higher in some cases), but typically not as significant of a reduction in power consumption as the power savings that results from attenuating masked low frequency signal components (e.g., in the manner described above).

Figure 1B:
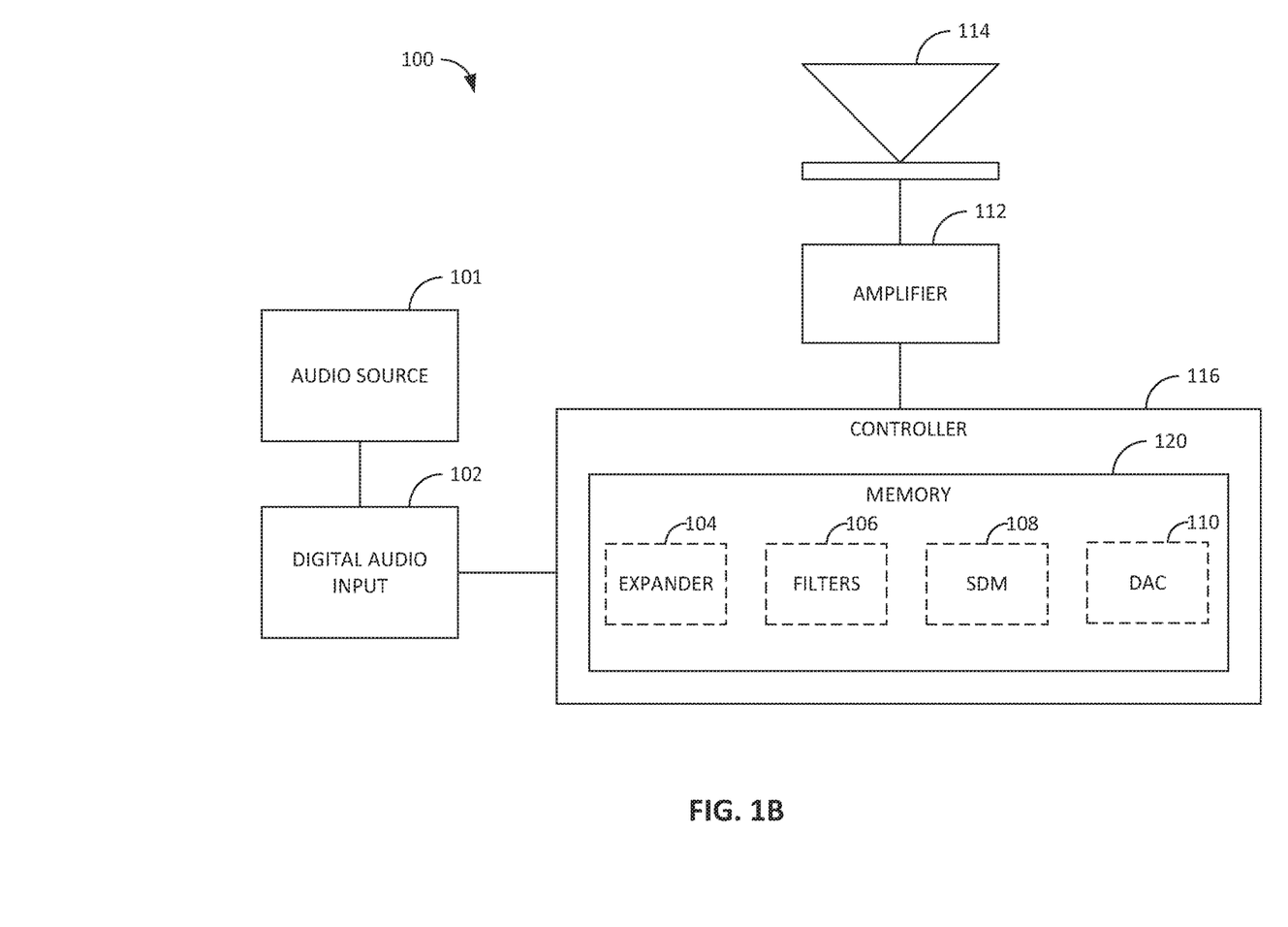
FIG. 1B is a block diagram illustrating an audio playback system that can include a system for reducing power consumed by the audio playback system, in accordance with an example embodiment of this disclosure.

In an embodiment, the controller 116 is in a signal path defined by other components (e.g., expander 104, filters 106, SDM 108, and/or DAC 110) of the audio system 100. For example, as shown in FIG. 1A, the controller 116 can be coupled to and/or included within the expander 104. The controller 116 may alternatively be disposed at another position in the signal path and/or included within another component (e.g., filter(s) 106, for example, the controller 116 can include or can be part of a digital signal processor that implements the filter(s) 106). In another embodiment that is illustrated in FIG. 1B, some or all of the audio playback system 100 components (e.g., expander 104, filters 106, SDM 108, DAC 110, any combination thereof, and so forth) can be implemented by the controller 116. For example, the controller 116 can be configured to execute modules 121 that cause the controller to perform operations of the expander 104, filters 106, SDM 108, and/or DAC 110. In yet another embodiment that is illustrated in FIG. 1D, the controller 116 can be part of the amplifier 112. For example, the controller 116 can include or can be part of logic for the amplifier 112. In this regard, some or all of the signal path can be integrated with the amplifier 112. The embodiments illustrated in FIGS. 1A, 1B, and 1D can be at least partially combined, for example, at least one portion of the signal path can be implemented by one or more discrete components and at least one portion of the signal path can be implemented within the controller 116 and/or amplifier 112.

Figure 1C:
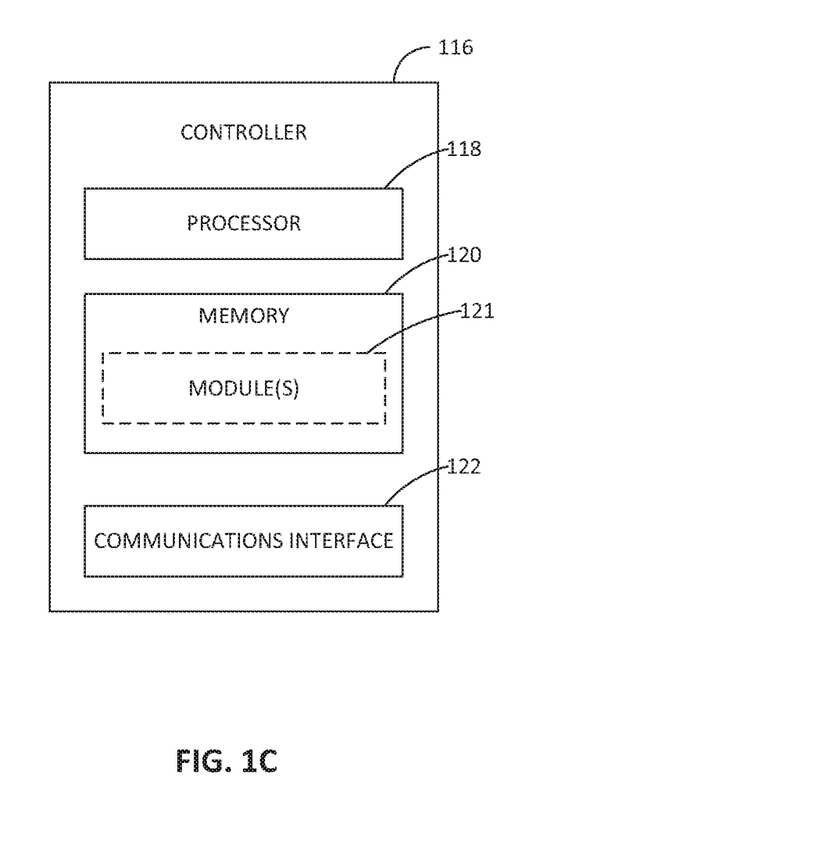
FIG. 1C is a block diagram illustrating a controller of an audio playback system, such as the audio playback system illustrated in FIG. 1A, FIG. 1B, and/or FIG. 1D, in accordance with an example embodiment of this disclosure.
Figure 1D:
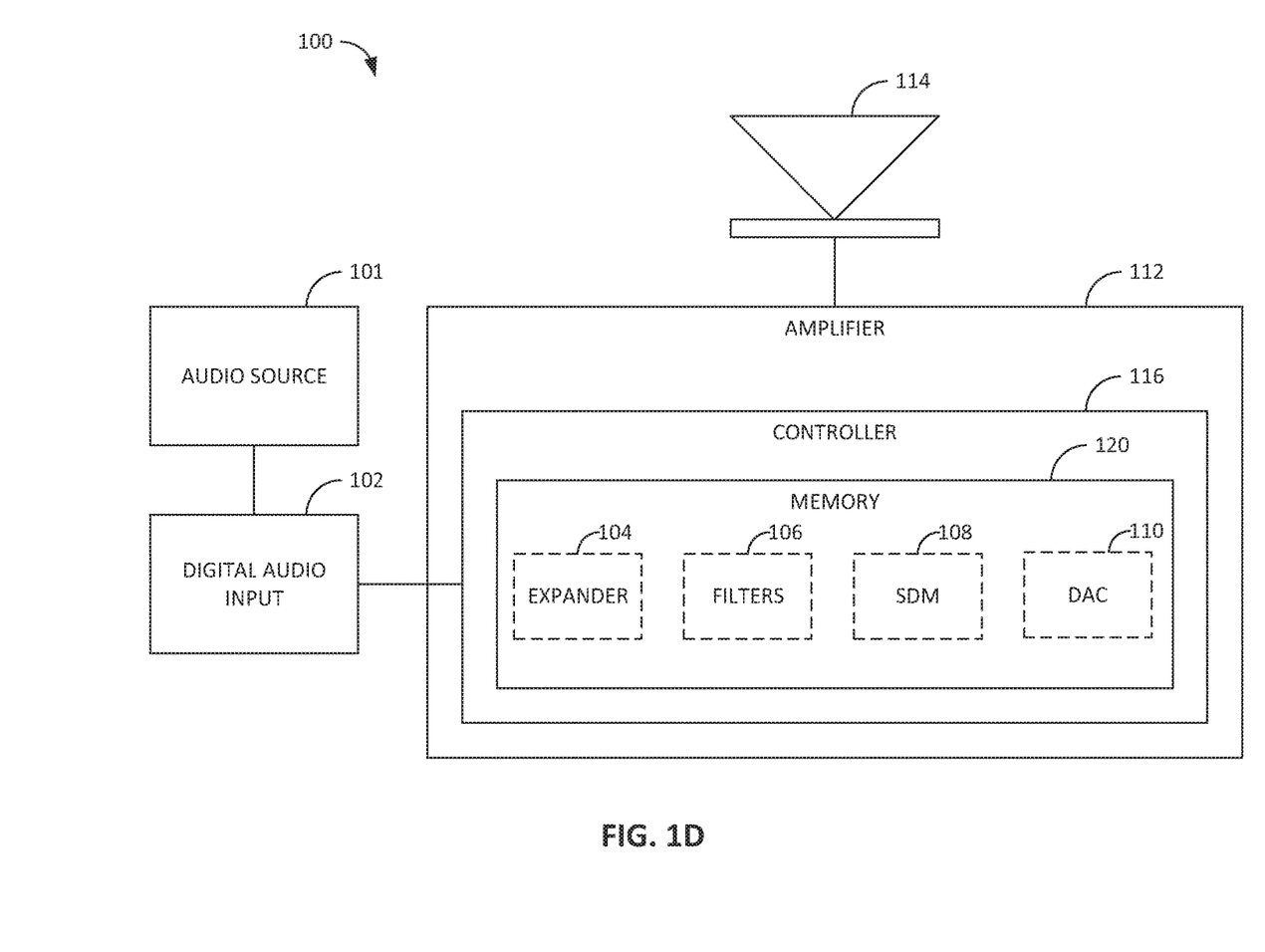
FIG. 1D is a block diagram illustrating an audio playback system that can include a system for reducing power consumed by the audio playback system, in accordance with an example embodiment of this disclosure.

As shown in FIG. 1C, the controller 116 can include a processor 118, a memory 120, and a communications interface 122. The processor 118 provides processing functionality for at least the audio playback system 100/controller 116 and can include any number of microprocessors, digital signal processors, micro-controllers, circuitry, field programmable gate array (FPGA) or other processing systems, and resident or external memory for storing data, executable code, and other information accessed or generated by the audio playback system 100/controller 116. The processor 118 can execute one or more software modules 121 embodied in a non-transitory computer readable medium that implement techniques described herein. The processor 118 is not limited by the materials from which it is formed or the processing mechanisms employed therein and, as such, can be implemented via semiconductor(s) and/or transistors (e.g., using electronic integrated circuit (IC) components), and so forth.

The memory 120 can be an example of tangible, computer-readable storage medium that provides storage functionality to store various data and or program code associated with operation of the audio playback system 100/controller 116, such as software modules 121 and/or code segments, or other data to instruct the processor 118, and possibly other components of the audio playback system 100/controller 116, to perform the functionality described herein. Thus, the memory 120 can store data, such as a program of instructions (e.g., modules 121) for operating the audio playback system 100 (including its components), and so forth. It should be noted that while a single memory 120 is described, a wide variety of types and combinations of memory (e.g., tangible, non-transitory memory) can be employed. The memory 120 can be integral with the processor 118, can comprise stand-alone memory, or can be a combination of both.

Some examples of the memory 120 can include removable and non-removable memory components, such as random-access memory (RAM), read-only memory (ROM), flash memory (e.g., a secure digital (SD) memory card, a mini-SD memory card, and/or a micro-SD memory card), magnetic memory, optical memory, universal serial bus (USB) memory devices, hard disk memory, external memory, and so forth. In implementations, the audio playback system 100 and/or the memory 120 can include removable integrated circuit card (ICC) memory, such as memory provided by a subscriber identity module (SIM) card, a universal subscriber identity module (USIM) card, a universal integrated circuit card (UICC), and so on.

The communications interface 122 can be operatively configured to communicate with components of the audio playback system 100. For example, the communications interface 122 can be configured to transmit data for storage in the audio playback system 100, retrieve data from storage in the audio playback system 100, and so forth. The communications interface 122 can also be communicatively coupled with the processor 118 to facilitate data transfer between components of the audio playback system 100 and the processor 118 (e.g., for communicating inputs to the processor 118 received from a device (e.g., audio source 101) communicatively coupled with the audio playback system 100/controller 116, e.g., via DAI 102). It should be noted that while the communications interface 122 is described as a component of an audio playback system 100/controller 116, one or more components of the communications interface 122 can be implemented as external components communicatively coupled to the audio playback system 100 via a wired and/or wireless connection. The audio playback system 100 can also include and/or connect to one or more input/output (I/O) devices (e.g., via the communications interface 122), such as a display, a mouse, a touchpad, a touchscreen, a keyboard, a microphone (e.g., for voice commands) and so on.

The communications interface 122 and/or the processor 118 can be configured to communicate with a variety of different networks, such as a wide-area cellular telephone network, such as a cellular network, a 3G cellular network, a 4G cellular network, or a global system for mobile communications (GSM) network; a wireless computer communications network, such as a WiFi network (e.g., a wireless local area network (WLAN) operated using IEEE 802.11 network standards); an ad-hoc wireless network, an internet; the Internet; a wide area network (WAN); a local area network (LAN); a personal area network (PAN) (e.g., a wireless personal area network (WPAN) operated using IEEE 802.15 network standards); a public telephone network; an extranet; an intranet; and so on. However, this list is provided by way of example only and is not meant to limit the present disclosure. Further, the communications interface 122 can be configured to communicate with a single network or multiple networks across different access points. In a specific embodiment, a communications interface 122 can transmit information from the controller 116 to an external device (e.g., a cell phone, a computer connected to a WiFi network, cloud storage, etc.). In another specific embodiment, a communications interface 122 can receive information from an external device (e.g., a cell phone, a computer connected to a WiFi network, cloud storage, etc.).

In embodiments, the communications interface 122 is configured to receive audio from an audio source 101 (e.g., a mobile device (e.g., smartphone, tablet, smartwatch, activity tracker, digital camera, notebook computer, portable media player, portable gaming device, portable storage device, etc.), an audio receiver, a television, a personal computer, or the like). For example, the communications interface 122 can include DAI 102. The communications interface 122/DAI 102 may be configured to receive audio signals from the audio source 101 via a communicative coupling. The communicative coupling can include a wired coupling, a wireless coupling (e.g., WiFi, Bluetooth, or the like), an optical fiber coupling, or the like.

Example Processes

Figure 3:
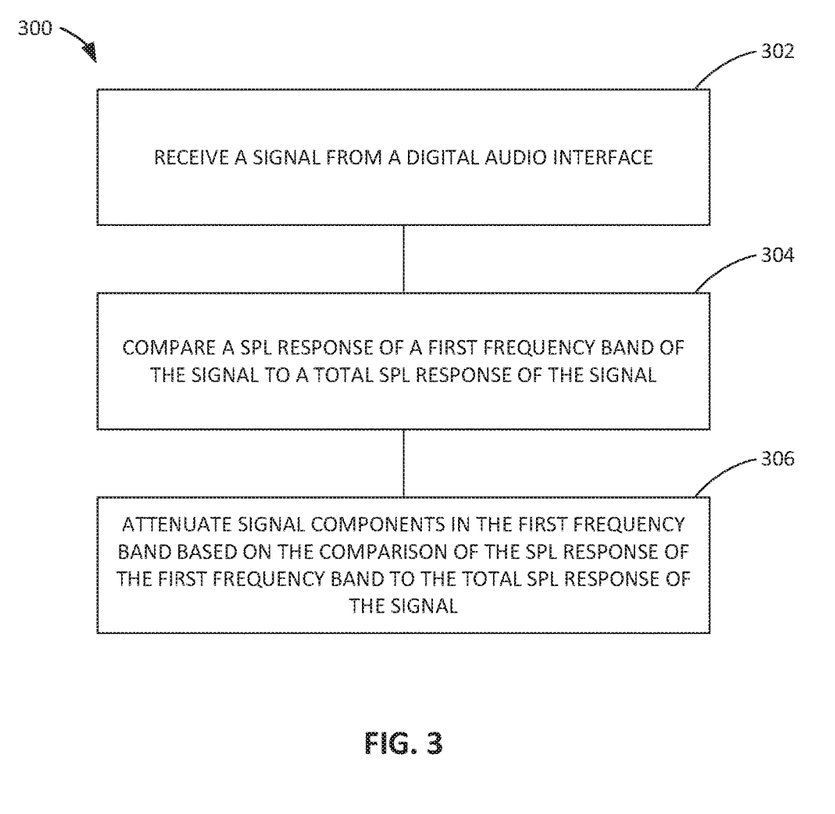
FIG. 3 is a flow diagram illustrating an example process for reducing power consumption of an audio playback system, such as the audio playback system illustrated in FIG. 1A, FIG. 1B, and/or FIG. 1D, in accordance with an example implementation of the present disclosure.
Figure 4:
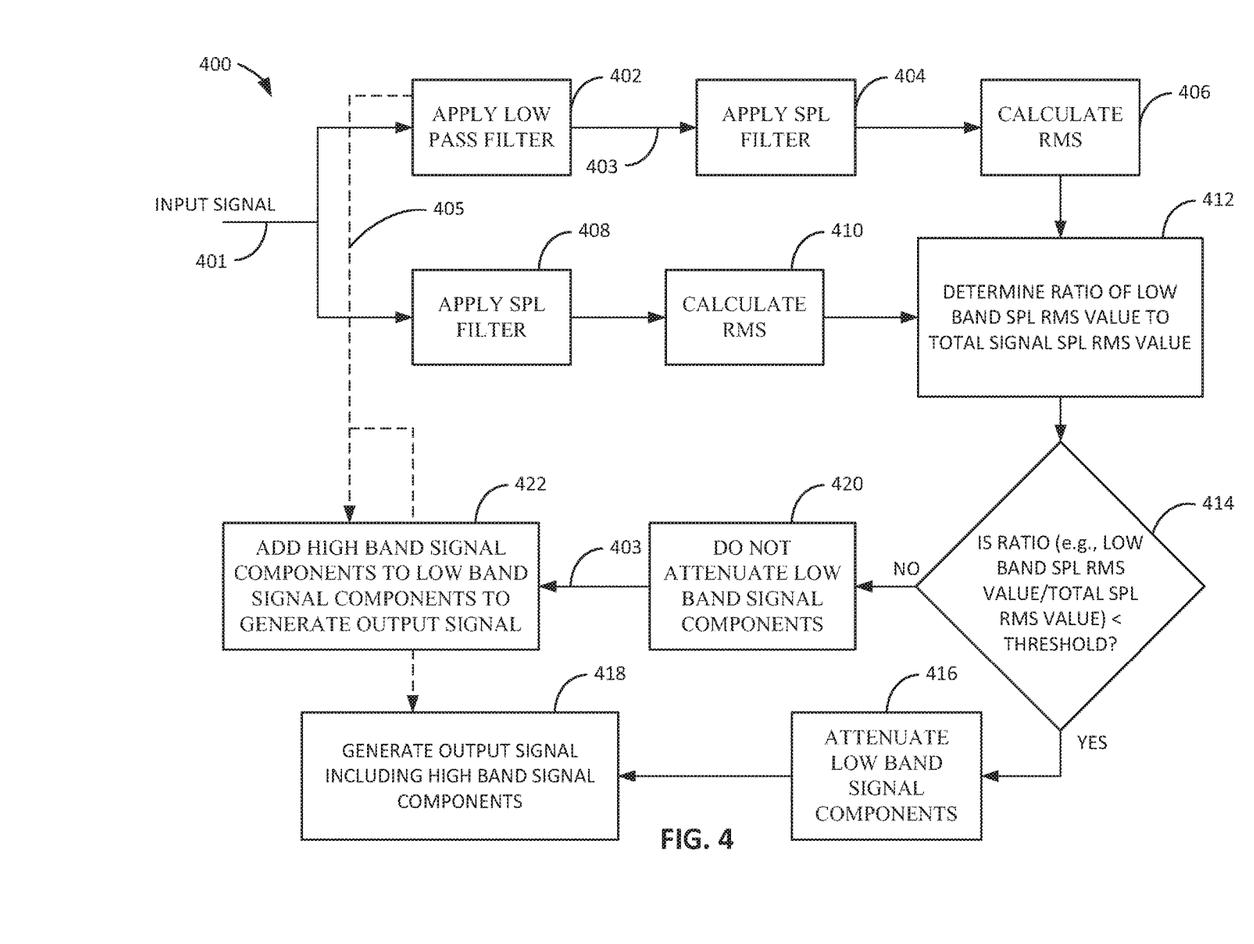
FIG. 4 is a flow diagram illustrating an example process for reducing power consumption of an audio playback system, such as the audio playback system illustrated in FIG. 1A, FIG. 1B, and/or FIG. 1D, in accordance with an example implementation of the present disclosure.

FIGS. 3 and 4 illustrate example processes 300 and 400, respectively, for reducing power consumption of an audio playback system, such as the audio playback system 100 illustrated in any of FIGS. 1A through 1D, or combinations thereof, by attenuating low frequency signal components based on SPL response of the audio playback system 100. In general, operations of disclosed processes (e.g., process 300 and/or process 400) may be performed in an arbitrary order, unless otherwise provided in the claims.

As shown in FIG. 3, a process 300 for reducing power consumed by an audio playback system (e.g., audio playback system 100) includes receiving a signal from a DAI (block 302). For example, the controller 116 can receive a signal from DAI 102. In some implementations, the signal is at least partially processed (e.g., partially attenuated, amplified, filtered and/or modulated) prior to being received at the controller 116. The signal can additionally or alternatively be at least partially processed after being processed by the controller 116 (e.g., after a controller 116 performs power savings operations described herein (e.g., blocks 304 and 306) on the signal. A SPL response of a first frequency band of the signal is then compared to a total SPL response of the signal (block 304). For example, the controller 116 can filter out high frequency components or otherwise extract/isolate signal components in a first frequency band that includes frequencies lower than a selected frequency. The controller 116 can then compare the SPL response of the first frequency band to the total SPL response of the signal. Based on this comparison, the controller 116 may attenuate signal components in the first frequency band of the signal (block 306). For example, the controller 116 may be configured to attenuate the signal components in the first frequency band of the signal based on a determined ratio of power levels, averages, aggregations/integrations, or other measurements or calculations associated with the SPL responses of the first frequency band and the total signal in comparison to one another. It is noted that, in some instances, the "total signal" can refer to a range of frequencies having a lower and upper cutoff frequency. For example, the total signal can be based on a dynamic range (e.g., effective dynamic range) of the audio playback system 100. In some implementations, the controller 116 is configured to attenuate the signal components in the first frequency band of the signal when a determined ratio of RMS values for the SPL response of the first frequency band and the total SPL response of the signal is less than a threshold ratio (e.g., a predetermined threshold ratio and/or a threshold ratio based on one or more parameters (e.g., SPL speaker response) of the audio playback system 100).

The process 400 illustrated in FIG. 4 is an example implementation of the process 300 illustrated in FIG. 3, where the signal components in the first frequency band are attenuated based on RMS values for the SPL response of the first frequency band and the total SPL response of the signal. The process includes receiving an input signal 401 (e.g., at controller 116 from DAI 102). The signal 401 is sent through two paths. In a first path, the signal 401 is filtered by a low pass filter (e.g., a low pass filter applied to the signal 401 by controller 116) that extracts signal components 403 in the first frequency band (e.g., signal components having frequencies less than the selected frequency) (block 402). The remaining signal components (i.e., signal components 405 in a second frequency band having frequencies greater than the selected frequency) may be preserved to be later included in an output signal (e.g., in an output signal generated at block 420 or 422). The signal components 403 in the first frequency band are filtered by an SPL filter (e.g., an SPL filter or determination module applied to the signal components 403 by controller 116) that converts the signal components 403 into an SPL response for the first frequency band (block 404). The controller 116 then calculates a RMS value of the SPL response of the first frequency band (block 406). Similar operations are performed on the total (or near total) input signal 401. The signal 401 is filtered by an SPL filter (e.g., an SPL filter or determination module performed by controller 116) that converts the signal 401 into a SPL response of the signal 401 (often referred to herein as the "total SPL response" of the signal 401) (block 408). The controller 116 then calculates a RMS value of the total SPL response of the signal 401 (block 410).

After calculating RMS values for the SPL response of the first frequency band and the total SPL response of the signal, the controller 116 determines a ratio of the RMS value of the SPL response of the first frequency band to the RMS value of the total SPL response of the signal (e.g., "Low SPL RMS"/"Total SPL RMS") (block 412). The controller 116 compares the determined ratio (e.g., "Low SPL RMS"/"Total SPL RMS") to a threshold ratio, which may be selected, predetermined, and/or based on the speaker SPL response (block 414). When the determined ratio is below the threshold ratio, the controller 116 attenuates the signal components 403 in the first frequency band (sometimes referred to as the "low band" signal components) (block 416). For example, the controller 116 can reduce the gain values of signal components in the first frequency band to zero, near zero (e.g., attenuate the signal components in the first frequency band to be substantially zero), or at least partially filter or otherwise eliminate them from the final output signal. In some implementations, the controller 116 generates the output signal including the signal components 405 in the second frequency band (e.g., the remaining "high band" signal components) (block 418). When the determined ratio is not below the threshold ratio, the controller 116 leaves the signal components 403 in the first frequency band intact; that is, the low band signal components (signal components 403) are not attenuated by the controller 116 (block 420). In such cases, the controller 116 may generate the output signal by adding the low band signal components 403 to the high band signal components 405 (effectively recreating the input signal 401) (block 422). In some implementations, the controller 116 preserves the input signal 401 or a copy of the input signal 401 and generates the output signal by simply outputting the preserved signal 401 instead of having to add the low band signal components 403 back to the high band signal components 405.

Generally, any of the functions described herein can be implemented using hardware (e.g., fixed logic circuitry such as integrated circuits), software, firmware, manual processing, or a combination thereof. Thus, the blocks discussed in the above disclosure generally represent hardware (e.g., fixed logic circuitry such as integrated circuits), software, firmware, or a combination thereof. In the instance of a hardware configuration, the various blocks discussed in the above disclosure may be implemented as integrated circuits along with other functionality. Such integrated circuits may include all of the functions of a given block, system, or circuit, or a portion of the functions of the block, system, or circuit. Further, elements of the blocks, systems, or circuits may be implemented across multiple integrated circuits. Such integrated circuits may comprise various integrated circuits, including, but not necessarily limited to: a monolithic integrated circuit, a flip chip integrated circuit, a multichip module integrated circuit, and/or a mixed signal integrated circuit. In the instance of a software implementation, the various blocks discussed in the above disclosure represent executable instructions (e.g., software modules 121) that perform specified tasks when executed on a processor. These executable instructions can be stored in one or more tangible computer readable media. In some such instances, the entire system, block, or circuit may be implemented using its software or firmware equivalent. In other instances, one part of a given system, block, or circuit may be implemented in software or firmware, while other parts are implemented in hardware.

It is to be understood that the present application is defined by the appended claims. Although embodiments of the present application have been illustrated and described herein, it is apparent that various modifications may be made by those skilled in the art without departing from the scope and spirit of this disclosure.

What is claimed is:

1. A method of reducing power consumption by an audio playback system, comprising:
   receiving a signal from a digital audio interface;
   comparing a sound pressure level (SPL) response of a first frequency band of the signal to a total SPL response of the signal, the first frequency band including frequencies lower than a selected frequency, by determining a ratio of the SPL response of the first frequency band of the signal to the total SPL response of the signal and comparing the determined ratio to a threshold ratio, wherein the selected frequency and the threshold ratio are based on a speaker SPL response; and
   attenuating signal components in the first frequency band of the signal based upon the comparison of the SPL response of the first frequency band of the signal to the total SPL response of the signal, when the determined ratio is less than the threshold ratio.

2. The method of claim 1, wherein determining the ratio of the SPL response of the first frequency band of the signal to the total SPL response of the signal includes:
   determining a root mean square value of the SPL response of the first frequency band of the signal;
   determining a root mean square value of the total SPL response of the signal; and
   determining a ratio of the root mean square value of the SPL response of the first frequency band of the signal to the root mean square value of the total SPL response of the signal.

3. The method of claim 1, wherein the signal components in the first frequency band are attenuated to zero, near zero, or completely removed when the determined ratio is lower than the threshold ratio.

4. The method of claim 1, further comprising:
   generating an output signal by adding the signal components in the first frequency band of the signal to signal components in a second frequency band of the signal when the determined ratio is greater than the threshold ratio, the second frequency band of the signal including frequencies greater than the selected frequency.

5. The method of claim 1, further comprising:
   attenuating signal components at frequencies above a second selected frequency, the second selected frequency greater than the selected frequency.

6. An audio playback system, comprising:
   a digital audio interface; and
   a controller configured to:
      receive a signal from the digital audio interface;
      compare a sound pressure level (SPL) response of a first frequency band of the signal to a total SPL response of the signal, the first frequency band including frequencies lower than a selected frequency, by determining a ratio of the SPL response of the first frequency band of the signal to the total SPL response of the signal and comparing the determined ratio to a threshold ratio, wherein the selected frequency and the threshold ratio are based on a speaker SPL response; and
      attenuate signal components in the first frequency band of the signal based upon the comparison of the SPL response of the first frequency band of the signal to the total SPL response of the signal when the determined ratio is less than the threshold ratio; and
   an amplifier configured to receive the signal from the controller and amplify the signal.

7. The audio playback system of claim 6, wherein the controller is configured to determine the ratio of the SPL response of the first frequency band of the signal to the total SPL response of the signal by:
   determining a root mean square value of the SPL response of the first frequency band of the signal;
   determining a root mean square value of the total SPL response of the signal; and determining a ratio of the root mean square value of the SPL response of the first frequency band of the signal to the root mean square value of the total SPL response of the signal.

8. The audio playback system of claim 6, wherein the signal components in the first frequency band are attenuated to zero, near zero, or completely removed when the determined ratio is lower than the threshold ratio.

9. The audio playback system of claim 6, wherein the controller is further configured to generate an output signal by adding the signal components in the first frequency band of the signal to signal components in a second frequency band of the signal when the determined ratio is greater than the threshold ratio, the second frequency band of the signal including frequencies greater than the selected frequency.

10. The audio playback system of claim 6, wherein the controller is further configured to attenuate signal components at frequencies above a second selected frequency, the second selected frequency greater than the selected frequency.

11. The audio playback system of claim 6, wherein the amplifier at least partially includes the controller.

12. A controller for an audio playback system, the controller comprising:
   a processor;
   a memory communicatively coupled to the processor, the memory having one or more modules stored thereon, the one or more modules, when executed by the processor, causing the processor to:
      receive a signal from a digital audio interface;
      compare a sound pressure level (SPL) response of a first frequency band of the signal to a total SPL response of the signal, the first frequency band including frequencies lower than a selected frequency, by determining a ratio of the SPL response of the first frequency band of the signal to the total SPL response of the signal and comparing the determined ratio to a threshold ratio, wherein the selected frequency and the threshold ratio are based on a speaker SPL response; and
      attenuate signal components in the first frequency band of the signal based upon the comparison of the SPL response of the first frequency band of the signal to the total SPL response of the signal when the determined ratio is less than the threshold ratio.

13. The controller of claim 12, wherein the one or more modules are configured to cause the processor to determine the ratio of the SPL response of the first frequency band of the signal to the total SPL response of the signal by:
   determining a root mean square value of the SPL response of the first frequency band of the signal;
   determining a root mean square value of the total SPL response of the signal; and
   determining a ratio of the root mean square value of the SPL response of the first frequency band of the signal to the root mean square value of the total SPL response of the signal.

14. The controller of claim 12, wherein the one or more modules are further configured to cause the processor to generate an output signal by adding the signal components in the first frequency band of the signal to signal components in a second frequency band of the signal when the determined ratio is greater than the threshold ratio, the second frequency band of the signal including frequencies greater than the selected frequency.

15. The controller of claim 12, wherein the one or more modules are further configured to cause the processor to attenuate signal components at frequencies above a second selected frequency, the second selected frequency greater than the selected frequency.

* * * * *